US012566197B2

(12) United States Patent
Gaarder

(10) Patent No.: US 12,566,197 B2
(45) Date of Patent: *Mar. 3, 2026

(54) METHOD AND APPARATUS FOR MONITORING POWER TRANSMISSION

(71) Applicant: Live Power Intelligence Company NA, LLC, Princeton, NJ (US)

(72) Inventor: Paal Even Gaarder, Oslo (NO)

(73) Assignee: Live Power Intelligence Company NA, LLC, Princeton, NJ (US)

( * ) Notice: Subject to any disclaimer, the term of this patent is extended or adjusted under 35 U.S.C. 154(b) by 84 days.

This patent is subject to a terminal disclaimer.

(21) Appl. No.: 17/072,805

(22) Filed: Oct. 16, 2020

(65) Prior Publication Data

US 2021/0033651 A1 Feb. 4, 2021

Related U.S. Application Data

(63) Continuation of application No. 16/810,479, filed on Mar. 5, 2020, now abandoned, which is a continuation of application No. 12/678,272, filed as application No. PCT/EP2008/061997 on Sep. 10, 2008, now Pat. No. 10,598,705.

(60) Provisional application No. 60/973,046, filed on Sep. 17, 2007.

(51) Int. Cl.
*G01R 21/133* (2006.01)
(52) U.S. Cl.
CPC .................................. *G01R 21/133* (2013.01)
(58) Field of Classification Search
CPC .................................................... G01R 21/133
See application file for complete search history.

(56) References Cited

U.S. PATENT DOCUMENTS

| | | | |
|---|---|---|---|
| 4,196,417 A | 4/1980 | Fashing et al. | |
| 4,709,339 A | 11/1987 | Fernandes | |

(Continued)

FOREIGN PATENT DOCUMENTS

| | | | |
|---|---|---|---|
| EP | 1030183 B1 | 3/2006 | |
| WO | 0077535 A1 | 12/2000 | |

(Continued)

OTHER PUBLICATIONS

Florkowski, et al., "Detection of transformer winding deformation based on the transfer function-measurments an simulations" Meas Sci Tech (2003).

(Continued)

*Primary Examiner* — Hyun D Park
(74) *Attorney, Agent, or Firm* — NOD Law PC

(57) ABSTRACT

An apparatus for measurement of power in an electric power transmission line is disclosed. The apparatus comprises a magnetic field sensor for measuring the magnetic field at the electric power transmission line and transmitting magnetic field data to a processor. The magnetic field sensor is arranged at a minimum threshold distance from the electric power transmission line. The apparatus also has a voltage sensor arranged distally from the magnetic field sensor for transmitting voltage waveform data to the processor and a transfer function calculator for calculating the relationship between the transmitted voltage waveform data at the voltage sensor and transmission line voltage waveform data.

19 Claims, 5 Drawing Sheets

(56) References Cited

U.S. PATENT DOCUMENTS

| | | | | |
|---|---|---|---|---|
| 4,796,147 | A * | 1/1989 | Anderson | H02H 3/253 |
| | | | | 361/65 |
| 5,006,846 | A * | 4/1991 | Granville | G01R 21/133 |
| | | | | 324/126 |
| 5,301,122 | A | 4/1994 | Halpern | |
| 5,408,176 | A | 4/1995 | Blatt et al. | |
| 5,448,555 | A * | 9/1995 | Bremer | H04N 21/4382 |
| | | | | 370/206 |
| 5,473,244 | A | 12/1995 | Libove et al. | |
| 5,729,144 | A | 3/1998 | Cummins | |
| 6,092,027 | A | 7/2000 | Takai et al. | |
| 6,265,881 | B1 | 7/2001 | Meliopoulos et al. | |
| 6,462,519 | B1 * | 10/2002 | McDaniel | G05F 1/70 |
| | | | | 323/211 |
| 6,639,413 | B2 | 10/2003 | Whitehead et al. | |
| 6,714,000 | B2 | 3/2004 | Staats | |
| 6,771,058 | B2 | 8/2004 | Lapinksi et al. | |
| 6,934,655 | B2 | 8/2005 | Jones et al. | |
| 6,956,364 | B2 | 10/2005 | Staats | |
| 7,054,795 | B1 | 5/2006 | Aves | |
| 7,076,378 | B1 | 7/2006 | Huebner | |
| 7,088,090 | B2 | 8/2006 | Staats | |
| 7,260,424 | B2 | 8/2007 | Schmidt | |
| 7,398,168 | B2 | 7/2008 | Lapinski et al. | |
| 7,498,821 | B2 | 3/2009 | Wells | |
| 7,519,454 | B2 | 4/2009 | Gardner et al. | |
| 7,571,028 | B2 | 8/2009 | Lapinski et al. | |
| 7,979,220 | B2 | 7/2011 | Scholtz et al. | |
| 8,280,652 | B2 | 10/2012 | Syracuse et al. | |
| 8,972,273 | B1 | 3/2015 | Abrishamain et al. | |
| 2001/0040446 | A1 | 11/2001 | Lapinski et al. | |
| 2002/0101231 | A1 | 8/2002 | Staats | |
| 2002/0136314 | A1 | 9/2002 | Maki et al. | |
| 2003/0144975 | A1 | 7/2003 | Kawamura et al. | |
| 2004/0021455 | A1 | 2/2004 | Staats | |
| 2004/0212512 | A1 | 10/2004 | Stewart | |
| 2005/0013080 | A1 * | 1/2005 | Pilz | H01H 9/56 |
| | | | | 361/115 |
| 2005/0062290 | A1 | 3/2005 | Stahlkopf | |
| 2005/0083206 | A1 | 4/2005 | Couch et al. | |
| 2005/0169056 | A1 | 8/2005 | Berkman et al. | |
| 2005/0187726 | A1 | 8/2005 | Korba et al. | |
| 2006/0247874 | A1 * | 11/2006 | Premerlani | G01R 19/2513 |
| | | | | 702/64 |
| 2006/0291856 | A1 | 12/2006 | Hampel | |
| 2007/0002653 | A1 | 1/2007 | Jung et al. | |
| 2007/0052493 | A1 * | 3/2007 | Lapinski | H01P 5/18 |
| | | | | 333/116 |
| 2008/0012720 | A1 | 1/2008 | Rostron | |
| 2008/0272934 | A1 | 11/2008 | Wang et al. | |
| 2009/0015239 | A1 | 1/2009 | Georgiou et al. | |
| 2009/0063228 | A1 | 3/2009 | Forbes | |
| 2009/0281679 | A1 | 11/2009 | Taft et al. | |
| 2009/0326731 | A1 | 12/2009 | Bowdry et al. | |
| 2010/0007354 | A1 | 1/2010 | Deaver et al. | |
| 2011/0074436 | A1 | 3/2011 | Nowicki et al. | |

FOREIGN PATENT DOCUMENTS

| | | | |
|---|---|---|---|
| WO | 0179872 | A1 | 10/2001 |
| WO | 2005006363 | A2 | 1/2005 |
| WO | 2006112839 | A1 | 10/2006 |
| WO | 2007030121 | A1 | 3/2007 |
| WO | 2009127706 | A2 | 10/2009 |

OTHER PUBLICATIONS

Okonmisk Rapport Feb. 2006 "Little brother is watching you . . . ," (available at http://www.orapp.no/nyheter/neringsliv/artcle64141. zrm) Mar. 5, 2006 (2 pgs.).

* cited by examiner

METHOD AND APPARATUS FOR MONITORING POWER TRANSMISSION

CROSS-REFERENCE TO RELATED APPLICATIONS

The present application is a continuation of U.S. patent application Ser. No. 12/278,672 filed on May 10, 2010, which claims the benefit of the filing dates of U.S. Provisional Patent Application Nos. 60/973,046 filed on 17 Sep. 2007 and 60/976,946 filed on 2 Oct. 2007.

The foregoing applications are hereby incorporated by reference in their entirety.

BACKGROUND OF THE INVENTION

Field of the Invention

The present invention relates to an apparatus and method for measurement of power in an electric power transmission line.

Brief Description of the Related Art

The traditional monopolies of electrical utility companies have been relaxed in the past few years in the European Union and in the United States. There has developed as a result a growing market in wholesale for electric energy. Utility companies, independent power producers, and power marketers as well as brokers are some of the participants in the volatile electricity supply market. It is known, for example, that variables such as the time of day and date, weather, temperature and oil prices play a role in the pricing of electricity in a given region. Furthermore, the pricing of the electricity is dependent on the operational status of electric generation and use facilities in that region as well as the transmission capacity of an electric power transmission network. The participants in the electric power markets require access to real-time information as well as historical data on the operational status of the electric generation and use facilities as well as the electric power transmission lines in the region. This information allows the development of trading strategies in electrical power and responses to power system events (such as disruptions in the power supply due to failures of transformers).

The relaxation of the monopoly status of traditional electric utilities has resulted in increased competition for customers among suppliers of electrical energy. Information relating to the use of electrical energy by the potential customers would be extremely useful to those involved in the bidding for electrical supply contracts. It would also be further advantageous to determine information on the supply and the demand of the electrical energy over time without having to directly connect to the electrical power transmission lines.

Methods and systems for the measurement for the electrical power transmission are known from several prior mi documents. For example U.S. Pat. No. 6,714,000 (Staats, assigned to Genscape, Inc.) teaches a method for the remote monitoring of the magnitude and the direction of net electrical power and count flow to or from a facility reduced monitored over a prolonged period of time. The method described in the '000 patent application" includes the detection and the measurement of the magnetic field emanating from the monitored electrical power transmission lines and detecting a signal which is synchronized to the power system frequency emanating from the power lines. The method further includes valuation, storing and transmission of the data on the electromagnetic field that emanates from the electrical power transmission line.

A further patent application, international patent application No. WO2006/112839 (Genscape Intangible Holding, Inc.) also teaches a method and a system for the substantially real-time monitoring of the operational dynamics of power plants and other components in an AC power grid. The monitoring is done by using information collected from a network of power grid frequency detection and reporting devices. The invention allows for the real-time detection and reporting of certain power grid events, such as a power plant trips or failures.

International patent application No. WO2007/030121 (Genscape Intangible Holding, Inc.) teaches a system for monitoring the power flow along an electric power transmission line which includes a plurality of magnetic field monitors placed at selected positions. The system further includes a central processing facility for the communication of the power flow to an end user.

European Patent No. EP 1 297 347 (Genscape Intangible Holding, Inc.) discloses an apparatus for remotely measuring and monitoring an electric power transmission line. The apparatus comprises a first sensor which is responsive to a first component of a magnetic flex density associated with the electric power transmission lines and which outputs a volt proportional to the magnetic flex density generated by current flowing through set electrical power transmission line. The apparatus further includes a second sensor which outputs a voltage proportional to a net electrical potential associated with the electrical power transmission line. The values for the voltage and the current flowing through the electrical power transmission line are passed to a central processing facility which combines the phase of the measured electrical potential with the phase of the measured magnetic flex density in order to determine the phase of the electrical potential relative to the magnetic flux density and that by determining from the face of the electrical potential relative to the magnetic flux density. The phase angle of the current flowing through the electrical power transmission line with respect to the voltage of the transmission line is also determined. A power factor on the electtic power transmission line and the magnitude and the direction of the power flowing through the electrical power transmission line is thereby calculated. It should be noted that the voltage sensor and the magnetic flux sensor are substantially co-located, as can be seen from FIG. 1 of the patent.

Other companies also measure power flowing along transmission lines. For example, the Norwegian company powermonitor.org supplies information about the German power plants. Their product is described in the article "Slik drives strpm-spionasje", Økonomisk Rapport April 2006, 40-41. Another Norwegian company, Energieinfo AS, Stavem, has filed a Norwegian patent application entitled "Fremgangsmate og apparat for overvåkning av produksjon og overføring av elektrisk kraft" (Application No. NO 2007 2653). The contents of this application are, however, not yet public.

SUMMARY OF THE INVENTION

The apparatus and method of the current invention allow the calculation of the magnitude and direction of power flow in substantially real time. The term "real time" in this context means that the calculation is carried out within a time frame of less than typically 20 milliseconds.

The apparatus and method of the current invention allow the measurement of the power factor—including both active and reactive power and also enable the measurement of the deviation of the power factor from the expected power factor. By "not real-time" or "close to real-time" we normally mean using measured values within, for example, 5-500 seconds in an algorithm that is configured to give secondary outputs such as U-1 phase angles, reactive power etc.

The apparatus and method of the current invention allow the measurement or the calculation of transfer function of signals in close to real time (i.e. within a time frame of, for example, 5 s to 500 s). Power grid parameters, such as the shape and behavior of the signals as well as the period of the signals, the nominal frequency of the signals (for example, 50 Hz in Europe or 60 Hz in the United States) as well as higher and lower harmonic frequencies, can also be measured. In one aspect of the invention, the apparatus and method of the current invention furthermore enable the measurement of deviations of these measured power grid parameters relative from the expected power grid parameters.

In one aspect of the invention, a power network database is built. The power network database comprised in close to real time power network data including the parameters and values of power production, power flow and more generally information about state of the grid. The power network database will also store the power network data for historical purposes.

In a further aspect of the invention, power network prediction models can be built which, using the power network data and historical data, describe the condition of power generation and power transmission system and also enable the prediction of the power transmission network's future behavior.

In a further aspect of the invention, state estimators are constructed using the power network prediction models which can be incorporated with further data from the power market, such as weather data, oil reserves, cultural aspects (including TV shows) and weather forecasts. This allows the building of a set of scenarios for the power transmission network with corresponding probabilities. Information about the scenarios can be sold.

DESCRIPTION OF THE FIGURES

For a more complete understanding of the present invention and the advantages thereof, reference is now made to the following description and the accompanying drawings, in which.

DETAILED DESCRIPTION OF THE INVENTION

For a complete understanding of the present invention and the advantages thereof, reference is now made to the following detailed description taken in conjunction with the Figures.

It should be appreciated that the various aspects of the invention discussed herein are merely illustrative of the specific ways to make and use the invention and do not therefore limit the scope of invention when taken into consideration with the claims and the following detailed description. It will be further appreciated that features from one embodiment of the invention may be combined with features from other embodiments of the invention.

The teachings of the cited documents should be incorporated by reference into the description.

Figure 1:
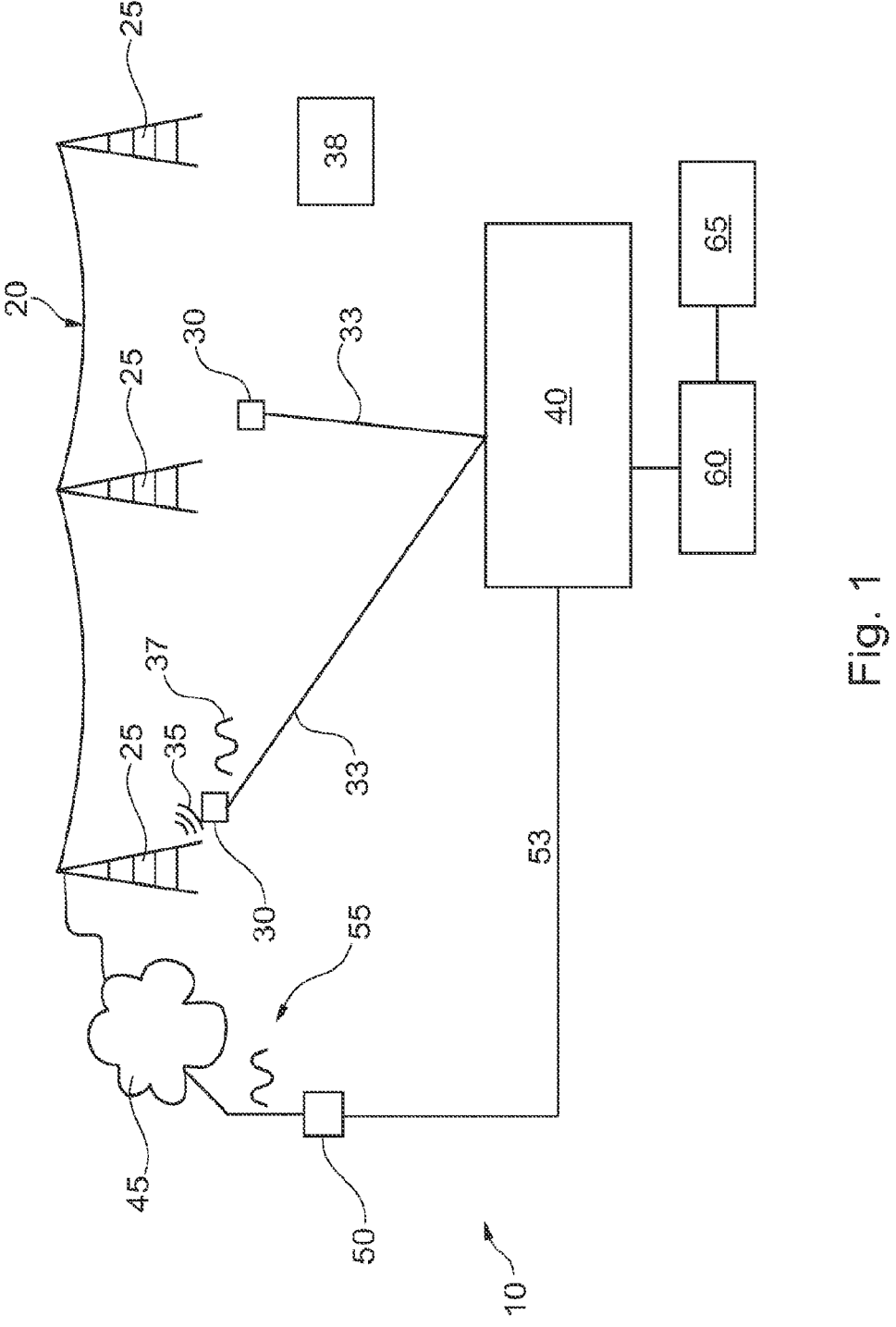
FIG. 1 shows an overview of the system.

FIG. 1 shows an example of the invention. FIG. 1 shows the complete system 10 for the measurement of power in an electric power transmission line 20. The electric power transmission line 20 is shown in FIG. 1 as a single line strung between pylons 25. It will be appreciated that the electric power transmission line 20 will be generally made up of multiple lines. Each of the multiple lines will carry a separate current and have a magnetic field 35 about the multiple lines. It will also be appreciated that the electric power transmission lines 20 may be laid on a surface or buried underground.

One or more magnetic field sensors 30 are mounted at a distance from the electric power transmission line 20. The magnetic field sensors 30 measure the magnetic field 35 generated by the electric power transmission line 20. Advantageously the one or more magnetic field sensors are arranged close to the base of the pylons 25. This is because the electric power transmission line 20 sags between any two of the pylons 35. The sag of the electric power transmission line 20 will increase in hot weather and also the electric power transmission line 30 may move during storms due to wind. The movement and/or sag of the electric power transmission line 30 will affect the magnetic field 35. If, however, the magnetic field sensors 30 are arranged close to the base of the pylons 25—at which point the electric power transmission line 20 is fixed—then the sag and/or movement of the electric power transmission line 20 will be substantially eliminated.

Typically, the magnetic field sensors 30 are placed between 25 and 400 m from the electric power transmission lines. The exact coordinates of the magnetic field sensors 30 are measured, for example, using the Global Positioning System as this information is needed to identify the electric power transmission line 20 being measured but also to calculate the power being transmitted over the electric power transmission line 20 as will be explained later.

It will be further noted that FIG. 1 shows only two of the magnetic field sensors 30 arranged at the bottom of two of the pylons 25 of the electric power transmission line 20. It will be noted that it is not necessary to have multiple magnetic field sensors 30 per pylon 25 or electric power transmission line 20. Generally, there will be one magnetic field sensor 30 for one single electric power transmission line 20, and n or less magnetic field sensors 30 if n electric power transmission lines 25 are close. By close is meant typically less than 1 km. For example if there are two electric power transmission lines 20 at 30 m distance (or two electric power transmission lines 20 at the same pylon 25) we can use a single magnetic field sensor 30 (which measures both the X and Y magnetic fields and the phase/time). The reason for this is because the time is measured very accurately, and not only the peak of the magnetic field signal. By inspecting the phase difference between the X and Y magnetically field sensors 30 (inside the same measurement unit) we are able to solve the equation for the current of two electric power transmission lines 20 if, at the same time, the geometry of the electric power transmission lines 20 and the placement of the measurement unit is known. The measurement is either done in real time (inside the measurement unit) or one needs to time tag the X and Y magnetic field measurements very accurately and do the computation afterwards. For calibration of the system and finding the transfer functions it is possible to use several measurement units at the same electric power transmission line 20 for a period of time.

FIG. 1 also shows a processor 40 connected to the plurality of magnetic field sensors 30 by first data lines 33. The first data lines 33 transfer in substantially real time magnetic field data 37 representing the magnetic field 35 measured by the magnetic sensor. A voltage sensor 50 is also connected to the processor 40 by second data lines 53. The second data lines 53 transfer in substantially real time voltage phase data 55 to the processor 40. The voltage sensor 50 is placed to the low voltage part of the power network. The low voltage part of the power network is connected through transformers and other lines (represented by reference numeral 45) to the electric power transmission network 20.

It will be noted that the processor 40 does not need to be situated close to the plurality of magnetic field sensors 30. Similarly, the processor 40 does not need to be situated close to the voltage sensor 50. The voltage sensor 50 needs to be connected to the same AC network as the electric power transmission line 20. In other words, there can be no DC connection between the voltage sensor 50 and the electric power transmission line. In Europe this requirement is met, for example, in the electric power grid of central Europe (i.e. Germany, Denmark, Netherlands, Belgium, France) and the electric power grid of Scandinavia (Sweden, Norway).

FIG. 1 also shows a clock 38. The clock 38 is highly accurate and is used to send time signals to local clocks at the magnetic field sensors 30 and the processor 40. The clock 38 could be the GPS system.

It should be further noted that the processor 40 does not need to be situated in any specific country since the processor 40 can acquire the magnetic field data 37 and/or the voltage waveform data 55 remotely. It will be noted that it is possible for the processor 40, the magnetic field sensor 30 and the voltage sensor to be in different countries.

A transform phase calculator 60 is connected to the processor 40. Typically the transform phase calculator 60 will be implemented as a software module running on the processor 40, but the transform phase calculator 60 could also be implemented in hardware (as an ASIC chip) or run on a second processor (not shown). In one aspect of the invention the transform phase calculator 60 and routines and algorithms used by the transform phase calculator 60 have access to a look-up table 65 implemented as a database. This aspect of the invention will be explained in more detail later.

The apparatus 10 shown in FIG. 1 is able by use of the magnetic field data 37 to determine the direction of the current flowing in the electric power transmission line 20 as the U-1 phase angle (to be explained later) and other power grid parameters. The other power grid parameters include but are not limited to the configuration of the power grid, capacitive load, HVDC load.

The apparatus 10 is able to monitor and evaluate frequencies in the electric power transmission line 20. The frequencies include not only the nominal frequency (50 Hz in Europe; 60 Hz in US) but also higher and lower frequencies as and when required.

Figure 2:
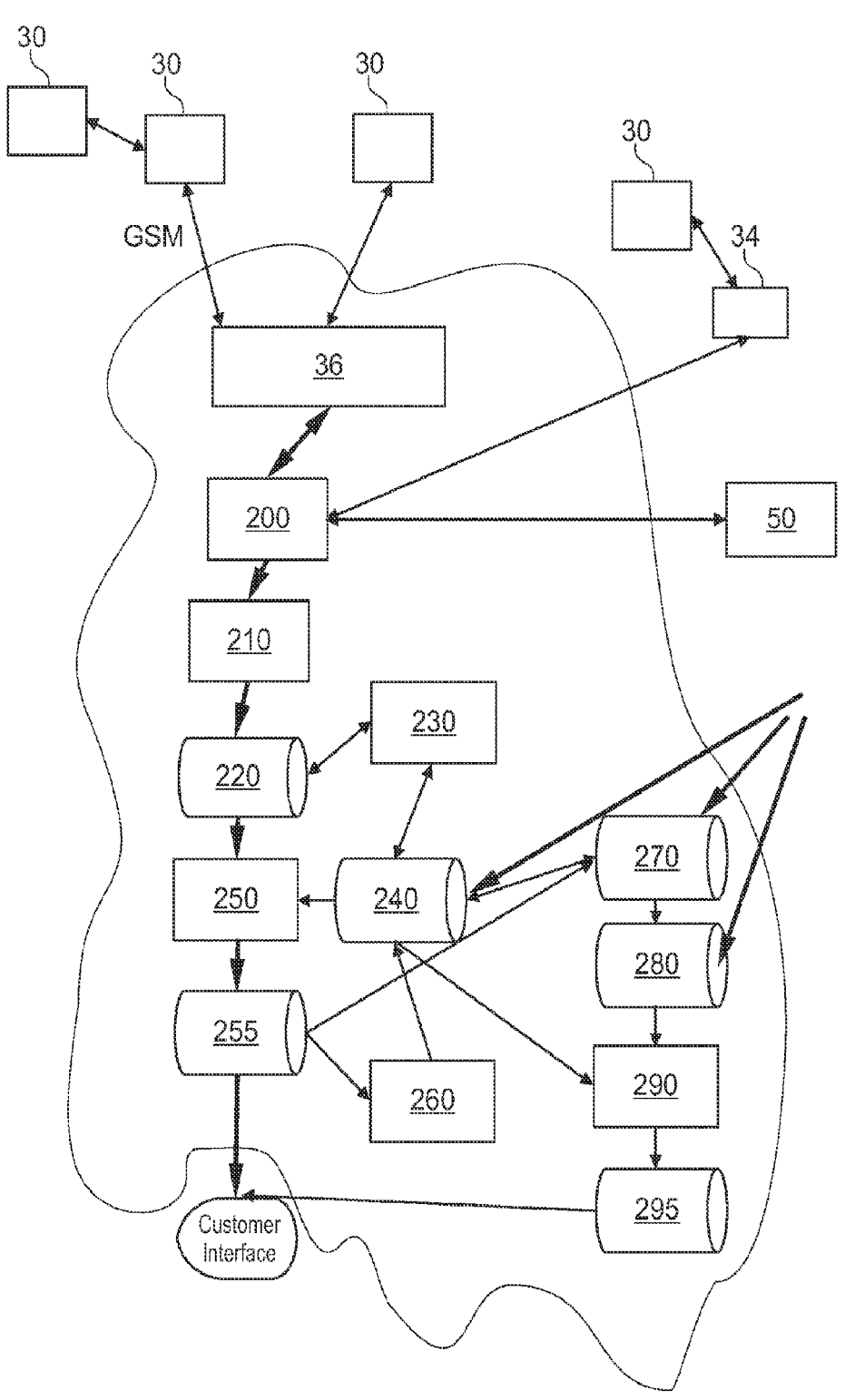
FIG. 2 shows an overview of the processes and the dataflow in the system in more detail.

It will be recognized that the first data line 33 and the second data line 53 do not have to be physical cables or other fixed lines. The first data line 33 and the second data line 53 could also be constructed from the General Packet Radio Service (GPRS) over the GSM mobile communications network. Alternatively, the first data line 33 and the second data line 53 could be implemented over the UMTS/3G mobile communications network, RF, satellite etc. The mobile communications network is shown in FIG. 2. It is preferred to use fixed lines as the use of the mobile communications network requires significant amount of power for the establishment of upstream data channels and/or downstream data channels as short intervals of data relating to the magnetic field data 37 and the voltage waveform data 55 will need to be established and transferred across the mobile communications network. In one aspect of the invention the magnetic field data 37 and/or the voltage waveform data 55 is not sent in real-time to the processor 40. Instead the magnetic field data 37 and/or the voltage waveform data 55 is temporarily stored and transmitted in bursts of data packets across the mobile communications network. This procedure is to increase the time between each data transfer and thus reduce the rate of establishment of connections.

In a further aspect of the invention a prediction algorithm is used to further reduce the amount of the magnetic field data 37 and/or the voltage waveform data 55. The prediction algorithm uses statistical and trend analysis of the magnetic field data 37 and/or the voltage waveform data 55 to predict the next values of the magnetic field data 37 and/or the voltage phase data 55. The same prediction algorithm is incorporated into the magnetic field sensor 30, (and the voltage phase sensor 50) and the processor 40. It will, of course, be appreciated that the prediction algorithm for the magnetic field data 37 will differ from the prediction algorithm for the voltage waveform data 55. The magnetic field sensor 30 and/or the voltage sensor 50 will then only need to transmit the magnetic field data 37 and/or the voltage waveform data 55 when the measured next values depart from the predicted next values generated from the prediction algorithm. This substantially saves data transfer and also reduces the rate of establishments of connections.

An analogy with vocal data transmission can serve to illustrate this point in more detail. Suppose Olga is a transmitter and Peter is a receiver and that Olga's task is to shout numbers to Peter. Olga needs to shout to Peter each time she wants to send numbers. Olga wants to shout as little as possible and so she writes down the numbers on a note before she sends the complete note to Peter. But Peter wants to get the numbers immediately and does not wait for the note. Normally the numbers are of the series "1, 2, 3, 2, 1, 2, 3, 2, 1 . . . " If, after Peter received the numbers 1, 2, 3 he does not get any more numbers from Olga, he continues to predict the numbers 2, 1, 2, 3, 2, 1, 2, 3 . . . based on the previous pattern of data that he has already received. Olga knows that Peter will do this, and it suits her because it obviates the need for her to shout each number. This stratagem works fine so long as she sees that the numbers she needs to send follow the series 1, 2, 3, 2, 1, 2, 3, 2, 1 . . . . Suddenly Olga sees that she needs to send a 4 and this number does not match the number predicted by her algorithm. She then shouts to Peter "Hello Peter, your algorithm is predicting wrongly. I will send you my note with the correct numbers!"

The apparatus 10 of the invention allows the determination of configuration of the power grid and conditions of the power grid relative to limits. Thus, the apparatus 10 will provide information about the situation concerning the power production and power grid and can also compare this information with respect to expected conditions. The determination of the power grid can be particularly useful to an independent power provider who does not have access to information relating to the structure of the power grid (which is held by the operator of the power grid).

The processor 40 can use the information gained from the magnetic field sensors 30 and the voltage sensor 50 to simulate the actions of producers of electric power, operators of the power grid and consumers. This provides information which can allow suitable action to be taken to match demand for electric power with the availability of electric power. For example, if there is lack of electric power in Italy, a generating station in Spain may be manually called in to add to capacity of the electric power on the power grid capacity. The apparatus 10 can evaluate or predict that such an action has already been done or—using available historical data—will be done by the generation station in Spain.

In one advantageous aspect of the invention, the processor 40 can simulate and determine the probability for development of different scenarios and different modes of operation of the power grid. This can be done by, for example, using State Estimators and Monte Carlo methods.

In one advantageous aspect of the invention, the processor 40 can use substantially real-time data together with historical data (stored in a database) in the simulations. The processor 40 can evaluate how these simulations may impact on the operation of the power grid and the probability of entering into changed modes of operation. In addition to the magnetic field data 37 and the voltage waveform data 55 the simulations can include historic data such as weather data, network configuration data, time-related data, energy price, energy reserves. These simulations can provide probabilities for the power production and the power grid to identify scenarios different from expected behavior.

In a further aspect of the invention, multiple magnetic sensors spread out are used in the same area. The magnetic sensors could either be mounted inside the same measurement unit or it can be several measurement units. By provides very accurate connect time measurement with each magnetic sensor. One can afterwards compare the phase and the magnitude of each of the measurements. By this one can perform calculations to find either unknown geometry of the lines and/or measure multiple lines with additive magnetically fields.

In a further aspect of the invention, a reference generator can be incorporated which can be either fully or partly in phase with noise in the magnetic field sensor 30 and induced in the magnetic field sensor 30 by the electric power transmission line 20. The source of the noise can be, for example, from the electric field surrounding the electric power transmission line 20. The magnetic field sensor 30 calculates the power and the direction of the power in the power transmission line 20 using the measured magnetic field and the reference generator.

The principles behind the invention will now be explained. It is known that power (P) is the product of voltage (V) and current (I), i.e.:

$$P = V*I \qquad \text{Eqn (1)}$$

Therefore, any approach to the measurement of electrical power flowing through an electrical power transmission line 20 must be based on the direct measurement of or derivation of current I and the voltage V flowing through the electrical power transmission line 20. The sign of the product of the voltage U and the current I give the sign of the power P. For time periods of less than a half cycle (i.e. <10 ms at 50 Hz) Eqn (1) is approximately valid both for DC and AC power.

The current I is measured in the invention using the magnetic field sensors 30 disposed along the electrical power transmission line 20. The magnetic field sensors 30 measure the magnetic field 35 associated with the electrical power transmission line 20. The current I through the electrical power transmission line 20 can then be calculated in accordance with Ampere's Law and the Biot-Savart law. Standard vector calculus, 1 D, 2D or 3D with one or several orthogonal sensors can be used if several lines in the electrical power transmission line contribute to the magnetic field 35 or if the lines do not have a one dimensional shape (for example due to sagging, as discussed above).

If the voltage V and the current I were always in phase with each other in the electrical power transmission line 20, then the scalar product of measured RMS voltage and measured RMS current would always indicate the instantaneous power in the electrical power transmission line 20.

However, in AC power systems, the voltage V and the current I are not exactly in phase, owing to the fact that loads may be reactive rather than resistive. This is due to the inductance and capacitance of the components (lines, cables, transformers etc.) making up the grid. This gives rise to the power factor being less than unity and therefore the phase difference between the voltage V and the current I must be determined to obtain an accurate computation of the power. The difference in phases between the voltage V and the current I is particularly noticeable at low electrical power flows and when faults occur in the power grid. The phase difference between the voltage V and the current I will also be significant for a time. The phase difference will end up at 180° when the power changes direction.

FIG. 2 shows a more detailed overview of the processor 40 according to the current invention. FIG. 2 shows the magnetic field sensors 30 located close to the electric power transmission lines 20. The magnetic field sensors 30 are connected to each other or to a mobile data access interface 36 via radio or through the mobile communications network (as discussed above). The wireless magnetic field sensors (30) may also be connected to a wireless LAN transceiver 34. The mobile data access interface 36 and the LAN transceiver 34 are connected to the processor 40 through the Internet.

The processor 40 comprises an authentification check 200 which is connected to the mobile data access interface 36 and the wireless LAN transceiver 34 to authenticate the data received at the processor. The authentification check 200 is also connected to the voltage sensor 50. It should be noted that there may be more than one voltage sensor 50 which may be placed in the same facility as the processor 40. The data from the magnetic field sensors 30 and the voltage sensor 50 is processed in the raw data storage processor 210 before being stored in the raw data databases 220.

A field description database 240 contains a set of data which describe a given configuration of the power grid. For example, a data set number could describe the configuration of the Scandinavian power grid in which each of fields in the data set describes the given configuration of each of the individual parts of the power grid, for example a closed breaker. The field description database 240 includes, but is not limited to data concerning breakers, a capacitor coupled to the power grid, the connections of the electric power transmission lines 20, the length of the electric power transmission lines 20, transformers etc. Another dataset could be exactly the same as the first data set except that one of the breakers has a different state, for example open. Part of the datasets and the data in the field description database 240 are obtained from public information or by manually inspecting the power grid. The rest of the dataset will mainly be calculated manually by inspecting the measured values or calculated automatically in accordance with this invention.

The processor 40 continuously monitors the data in the system and calculates the configuration of the power grid at a given time. By such means, it is possible for the processor 40 to determine the given configuration for the power grid at a given time and to use the field description database 240 as a look-up table for input in a grid configuration process 260. Let us take an example. Suppose that the processor 40 detects a rapid change in the Uxl phase angle from 15 degree to 2 degree within 60 s. The processor 40 will then inspect the current data set in the field description database 240 and in so doing determine that this change of the Uxl phase angle is typically (or can only be) because one of the breakers changed from a closed state to an open state. An additional capacitive load made the power grid more reactive (which leads to a reduced phase angle). The grid configuration processor 260 will then update the current state in the field description database 240 to fit the new configuration of the power grid.

If there is a new configuration in the power grid which does not match any of the existing states in the field description database 260, the grid configuration processor 260 will either try to define a new state and inform an operator or the grid configuration processor 260 will issue an alert and ask for assistance from an operator.

A statistics and probability database 270 continuously maintains statistics and determines probabilities for the state of the power grid. One example would be the expected power flow to a given consumer at a given day and time. For example, in a given one of the electric power transmission lines 20 at a given time, the probability for a power flow of 60-100 MW might be determined as 68%, the probability of a power flow greater than 160 MW as 22%, and the probability of a power flow greater than 120 MW as 32% etc.

An economic features database 280 contains information related to indirect parameters which can influence the states and actions of the power grid. These indirect parameters include history, real-time and future parameters such as weather forecast, fuel prices, water value, etc.

An estimator module 290 obtains the current state from the field description database 240, obtains statistics and probabilities from the statistics and probability database 270 and the economical features database 280 and constructs new possible grid states with an estimated probability. The new possible grid states are, for example, stored in a database's mirror database 295.

In addition, there are a number of processes and databases that monitor the entire system and perform quality control, SMS handling, VPN security, calibration etc.

Figure 3:
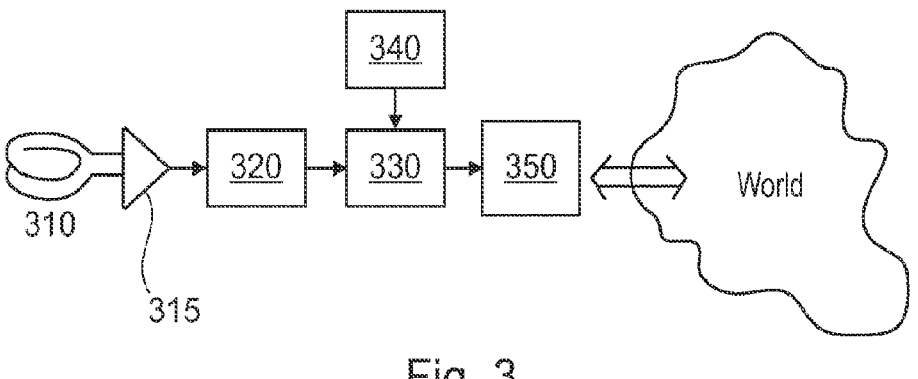
FIG. 3 shows the magnetic field. Sensor.

FIG. 3 shows an example of the magnetic field sensor 30 which comprises a sensing coil 310 connected to an amplifier 315 and then to an analog-digital converter 320. As discussed above, the magnetic field sensor 310 measures the magnetic flux in the field close to the electric power transmission lines 20 in real-time and is typically placed 25~400 m away from the electric power transmission line 20. The magnetic field sensor 20 is typically configured to measure at suitable time intervals, but also if needed may be configured to measure the change of the flux of the magnetic field continuously. The measurements taken of the magnetic field may be the bottom-peak value, the integral, the shape, the frequency etc. The magnetic field sensor 30 comprises one or more magnetic sensor that typically include the search coils 310. In FIG. 3 only one search coil 310 is shown, but this is not limiting of the invention. The search coil 310 outputs a voltage signal almost proportional to the change per time in the magnetic flux. It should be noted that other types of magnetic sensors can be used. The A/D converter 320 converts the measured voltage values from the search coils 310 to digital values.

The magnetic field sensor 30 further includes a microprocessor 330 which processes the digital values from the A/D converter 320 and a global positioning and time unit 340 which measures the exact position of the magnetic field sensor 30, usually using the GPS system and also the time. The magnetic field sensor 30 typically includes a GSM module 350 for transmitting the data to the processor 40. As discussed above, the GSM module 350 could be replaced by other data transmission devices.

The magnetic field sensor 30 has an exact known position in space. This position is calculated using the global positioning and time unit 340 or could be done using trigonometric measurements. The global positioning and time unit 340 with the microprocessor 330 is able to very accurately tag all of the measurements with the given time at the given place of the magnetic field sensor 30. In combination with the overall global position and timing system it is therefore possible for the processor 40 to treat all of the magnetic field sensors 30 in the system as a single composite unit which virtually operates in real-time.

Let us take an example. Consider a 50 ms long snapshot of the current signal over the whole power grid taken at the same time. The electric power transmission lines 20 surrounding the magnetic field sensors have an exact known position in space. This known position can be either be relative to the magnetic field sensors 30, it can be obtained from official information such as maps etc., or from measurements made using mobile GPS units, etc. Using this known position it is possible to make a mathematical model of the magnetic field at which the magnetic field sensor 30 is placed and to set up equations describing how the magnetic field is dependent on the current in the electrical power transmission lines 20. Basic linear algebra, for example, can be used to solve these equations.

Global Grid Position and Timing system (GGPT) units are placed in all of the measurement units such as the magnetic field sensors 30, the processor 40 and the voltage sensor 50 and provide accurate time data for all parts of the system. The GGPT units are represented on FIG. 1 as the clock 38. The GGPT units allow spatial data to be computed based on geometry and the variation of signal speed with time. The GGPT system is similar to the well-known Global Positioning System (GPS). The GGPT system is based mainly on one or several of the known timing systems. These timing systems include, but are not limited to, US GPS satellites, the forthcoming Galileo European Satellites, very accurate RF timing signals, cellular mobile phones RF signals, accurate local real time clocks and local accurate geometry measurements. The GGPT system and the GGPT units have an accuracy and resolution typically down to nanoseconds and less than one meter in time and space. The accuracy serves as the basis for evaluating the transfer of a given power signal on the power grid from one location to another location. In a further aspect of the invention the time is measured as the point at which the voltage signal crosses the average voltage value.

The nominal power signal on the power grid has a nominal frequency of 50 Hz in Europe and 60 Hz in the US. The nominal power signal has a substantially sinusoidal form. In theory it would not be possible to extract one period from another in a perfectly linear network. But due to imperfections in the power grid, there are variations in frequency (of approximately a few hundred MHz) and the power signal has an imperfect sinusoidal form due to disturbances from power producers, the power grid itself and consumers. This will lead to overlying frequencies (for example harmonics) of the nominal frequency. These unique mixed signals, naturally self-generated on the power grid, can then be handled as input and output in a network analyzer.

Figure 4:
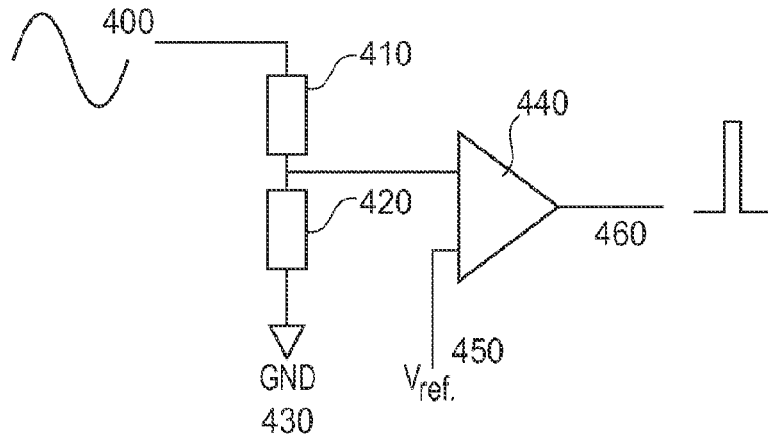
FIG. 4 shows the voltage phase sensor

The function of the voltage sensor 50 is to measure the phase of the voltage signal. As discussed above, the voltage sensor 50 is typically located in an office, near a centralized computer or at a position where there is very low noise on the voltage signal. FIG. 4 shows a schematic diagram of the voltage sensor 50 according to one embodiment of the invention.

The voltage sensor 50 includes a comparator 440. One input of the comparator 430 is connected between a voltage divider formed from resistances 410 and 420. One input of the resistance 410 is connected a domestic power outlet (typically 220V AC in Europe) 400. One input of the resistance 420 is connected to ground 430. It will be noted that the domestic power outlet 400 can be several hundreds of kilometers from the power grid in which the power flow is calculated. This is feasible as long as a transfer function between the locations of the power grid and the location of the voltage sensor 50 is known or can be calculated.

The other input of the comparator 440 is set to a fixed and very stable threshold voltage, $V_{ref}$ at 450 which close to 0 volt. An output 460 of the comparator 440 will typically go high when the input from the voltage divider is equal or larger than the threshold voltage $V_{ref}$ at 450. The actual magnitude of the fixed threshold voltage $V_{ref}$ is not important and may be unknown, but the fixed threshold voltage Vref must be very stable over time. Optionally, the threshold voltage could be given as the average of the maximum and minimum of the peak voltage measured at the domestic power outlet 400. The comparator 440 has a type of hysteresis so the output 460 is given only when the input voltage from the voltage divider goes from negative to positive. In an alternative aspect of the invention, the hysteresis is not needed. However, it has been discovered that if no hysteresis is used it will slightly complicate the operation of the voltage sensor 50 and the subsequent calculations in the GGPT. The duration of the high output at 460 from the comparator 440 does not need to be known. The duration should be sufficiently high, e.g. higher than 100 µS so to allow a microcontroller for example to use the start of the ramp of the output of the comparator as an input. The comparator 440 is typically turned on every time a trigger is to be used by the GGPT, e.g. example every 10 s.

In a further aspect of the invention, the time is measured as the point at which the voltage signal crosses the average voltage value.

Figures 5, 6:
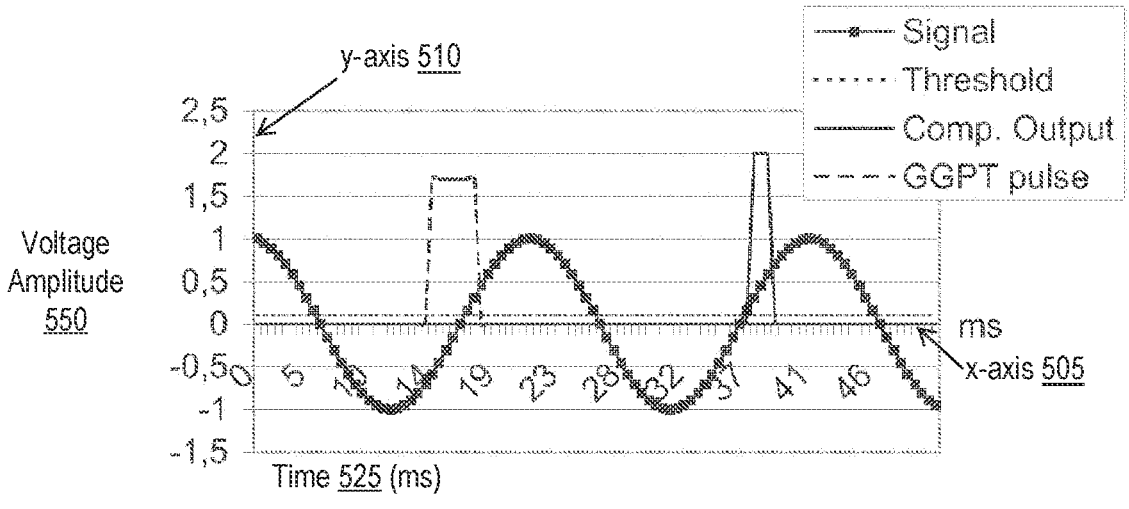
FIG. 5 shows the trigger signal from the voltage sensor
FIG. 6 illustrates an example of the determination of power flow direction.

FIG. 5 below compares graphically an input signal for the GGPT (IN) and the trigger signal (TR) generated from the comparator 440.

The calculation of the U-I phase angle by use of the GGPT will now be explained. Suppose it is required to calculate the U-I phase angle at a given location on the power grid. The common way to calculate the U-I phase angle is to subtract the time difference between the sinusoidal current waveform I and the sinusoidal voltage waveform U where they both cross the time axis and then transform the time difference to an equivalent phase difference in radians based on the known time period.

The magnetic field sensor 30 tag all of the measurements of the sinusoidal current waveform I with exact times relative to the GGPT system at a first location. At, or at almost (for example ±5 s) the same time, the voltage sensor

50 gives an exact time for the sinusoidal voltage waveform somewhere else relative to the GGPT system at a second location. By the use of lookup tables for the transfer function of the voltage from the first location to the second location, it is possible to calculate the timing of the voltage waveform U at the same place and time as the first location at which the current measurement was done. This then allows the matching of the period of the current waveform I and the period of the voltage waveform U at a given place and time.

The voltage sensor 50 can output a pulse and time tag for every period (i.e. every ⅕₀th second in Europe or ⅙₀th second in the USA) or at intervals of several seconds. To avoid too large a quantity of data in the database, the voltage sensor 50 does not normally output a time tag for every period of the voltage waveform U. If the voltage sensor 50 does not output a time tag for each period, the time must be adjusted to fit the given period measured by the magnetic field sensor 30. Specifically, the adjustment is needed to extrapolate the elapsed time period owing to slight fluctuations of the actual time period relative to the nominal time period of the power grid caused by frequency fluctuations.

The correction time is given by the Equation:

$$n \cdot time\_period \cdot adjustment$$

where n is the number of period mismatches between the two measurements at the first location and the second location, time_period is the nominal time period of the power grid and is given by 1/f where f is the AC supply frequency (typically 50 Hz or 60 Hz) and adjustment is an adjustment value derived from an adjustment table. This adjustment table is continuously being built up by the voltage sensor 50 which normally make measurements in shorter periods than the magnetic field sensors.

This adjustment table will typically include several records. For example, the adjustment table can have a record with a field n and a field adjust. In the initial record, the field n can, for example, have the value 45678 and adjust the value 20.001 which indicates that the time period was 1 µs longer than nominal time period at the time of the recording of the initial record. 25 periods later another record is created and the value of n=45703. The adjust value is 20.0015 which indicates a period time I.5 µs longer than the nominal time_period. Similarly, at a further 25 periods the value of n=45728 and the adjust values is 20.002—indicating a period time 2 µs longer. If the magnetic field sensors carry out the measurement of a period which is 55 periods after the initial record and the voltage sensor 50 performs the measurement 50 periods after the initial record (i.e. at the second record above) we can now interpolate from the adjustment table the delta t the peak of the voltage waveform which will have changed over the 5 periods at which the measurements made by the magnetic field sensors 30.

It will, of course, be noted that if the voltage sensor 50 and the magnetic field sensors 30 perform the measurements at the same period this adjustment will not be needed.

The lookup tables for the transfer function stored in the field description database 240 are predefined and pre-calculated continuously mainly by the configuration module 260.

The GGPT is able to generate an electrical pulse at the same relative time all over the power grid, or at least a pulse which is afterwards possible to calculate backwards to give a relative time tag all over the power grid. An example of a time pulse from the GGPT is shown in FIG. 5 IN. The time difference $\Delta_{tV}$ can be measured between the ramp of the time pulse (IN) generated by the GGPT and the ramp of the comparator output 460 shown as TR in FIG. 5. As an example, in FIG. 5 $\Delta_{tV}$, we need to put in the right notation for underscore v, either mms or ttms! is approximately 23 ms. The time transfer function for a voltage signal in the power grid at the given grid configuration has previously been determined to be $U_{t\_trans}$(condition,x,y,z) and in this case is stored in the lookup tables in the field description database 240 and is found to be 12 ms. One example of this can be the propagation time from a given place in Spain to a given place in Poland. By now adjusting for the calibration of the system and taking into account the adjusted transfer function this will give us the unknown phase time U(t,x,y,z) of the voltage at any known place at any location on the power grid.

Let us take as an example at a location A having the co-ordinate (x,y,z) where a given magnetic field sensor 30 is located, the current at the magnetic field sensor 30 at the location A (x,y,z) will have the same time difference $\Delta_t$ relative to the time pulse from the GGPT. So, the Uxl phase at which the magnetic field sensor 30 is located will be given by:

$$Uxl\ \text{Phase}(condition,t,x,y,z)=(\Delta_{tV}-(\Delta_u+n\text{-}$$
$$\text{time\_period·adjustment})-U_{t\_trans}(condition,x,y,z)$$
$$*2\pi/T$$

where T is the time period of the AC supply.

Another way to find the direction of the power and power factor will now be described. In this example, the power factors and the direction of the power can also be determined by signal analysis. The magnetic field sensor 30 analyzes the shape of the measured alternating current signal. Ideally, the shape of the measured alternating current signal is a sinus with a fixed time period T (T=1/50 s in Europe or T=1/60 s in US). In practice, the power grid's alternating current sinusoidal waveform has deviations from a perfect sinusoid waveform. This may be, for example, due to inaccuracy in power production, devices installed in the power grid (for example HVDC), resistive, inductive, capacitive loads, and noise from the consumers (e.g. high frequency switching consumers). As an example, a transformer station with a high grade of saturation (e.g. at maximum throughput) will cause harmonic frequencies superimposed on the nominal sinusoidal waveform both on the input currents and on the output currents. These harmonics may be of a frequency in the range 1000-2000 Hz, for example, and will overlay and deviate the sinus of the measured alternating current signal at nominal frequency.

Figure 7:
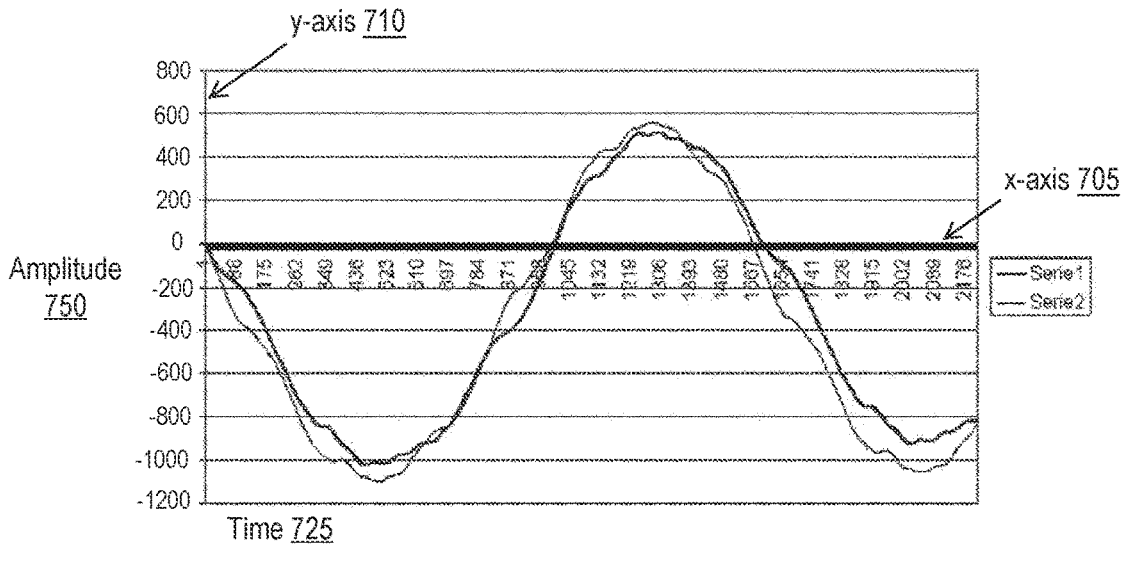
FIG. 7 shows the power flow from Sweden to Norway

FIG. 7 shows two examples of a 50 Hz sinusoidal waveform with superimposed higher frequencies. The term "sinus-noise" will be used for these deviations from the ideally preferred shape. Some of this sinus-noise will be related to the voltage, some of the sinus-noise related to the current and some of the sinus-noise related to the Uxl phase angle. For the main part of the sinus-noise there will be a correlation of the contribution to voltage noise, current noise and Uxl phase angle noise at the same time. Using the magnetic field sensors 30 it is only possible to inspect the sinus-noise related to the current, so the focus is on the sinus-noise seen on the current signal. Owing to the physical relation between the current sinus-noise and the Uxl phase angle it is then possible to determine the Uxl phase angle indirectly from the sinus-noise in the current signal. It is hence possible to determine from the Uxl phase angle the direction of the power and the reactive power.

FIG. 6 illustrates a computation done on an electrical power transmission line to determine the direction of the power. FIG. 6 shows a pair of sinusoidal power sources 600 and 620 which supply power to consumers 610 and 630. To illustrate the problem, we have introduced a "black box"

where we measure inside without any information from outside. If we measure the alternating current in a black box 640 at a middle point 650, we shall see the charge carriers moving in one half of the cycle from point 660 to point 670. In the other half of the cycle from point 670 to point 670—ideally in the form of a sinusoidal waveform. If previously we know the RMS voltage of the circuit then this will enable us to calculate the amount of power, but not the direction or the active part. It will not be possible to determine whether the power is flowing towards the point 660 or towards the point 620.

Almost all circuits have some kind of asymmetry. This will be also true at the middle point 650 of the circuit of FIG. 6. By carefully inspecting the current signature of the alternating current signal in the circuit, one will normally see that the alternating current signal does not have a perfect sinusoidal waveform as described above. The alternating current signal will be normally asymmetric. This asymmetric deformation of the sinusoidal waveform will normally be changed or just mirrored when the power direction changes, using this information we are able to know when the power direction changes.

Figure 8:
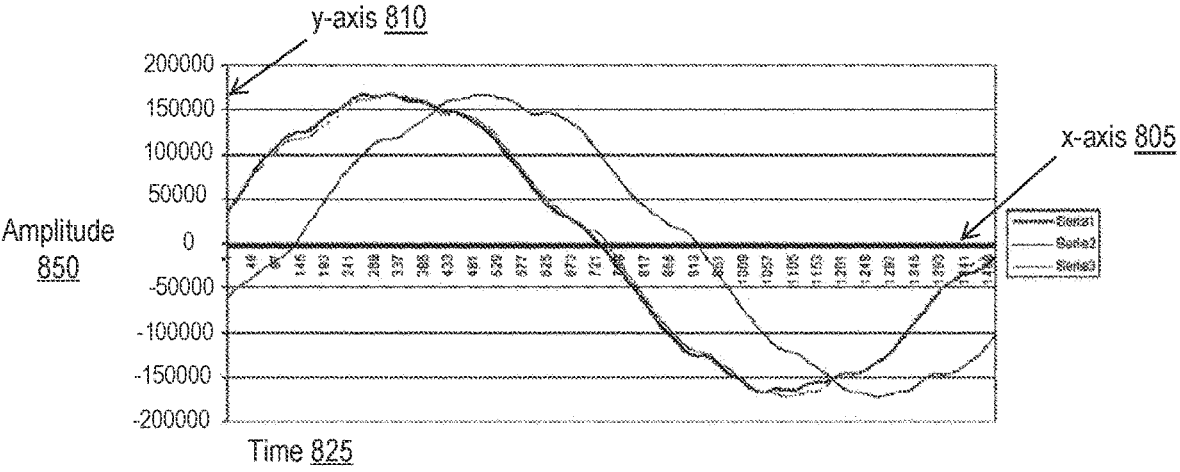
FIG. 8 illustrates the determination of the direction of power flow.

Consider FIGS. 7 and 8 which show examples of two measurements of the electric power transmission line 20 from Norway to Sweden. The first measurement denoted by "serie1" is done when there is a flow of power from Norway to Sweden. The second measurement denoted by "serie2" is done about 1 hour later when there is a flow of power from Sweden to Norway. By carefully matching the graphs by mirroring them and making appropriate adjustment one can clearly see that the shape is substantially identical. The appropriate adjustment can be, by way of example, to multiply by a factor k and/or to shift the graph in the time domain.

This is shown in FIG. 8. As can be seen, the curve "Serie2" in FIG. 7 (where the power flow is in the opposite direction of curve Serie1 1 hour earlier) is now scaled by a factor k and "mirrored" to fit the curve "Serie1." The curve "Serie3" is the same as the curve "Serie2", but just shifted in time in order to fit to the curve "Serie1". By doing this we see that we can get a better match of the two measurements, and further conclude that the power has changed direction. If the power had not changed direction in the two measurements, we should see that the curve Serie1 and the curve Serie2 in FIG. 7 would match better than the curve Serie1 and the curve Serie2 curves in the FIG. 8.

This simple example and analysis show it is possible to determine the change in the power direction without knowing or measuring the voltage in the circuit.

This can be done mathematically inside the measurement unit 30 or in the processor 40 by storing a set of digitized values of one period of the sinusoidal waveform of the alternating current signal I to give a set of values $I_1$. The set of digitized values is mirrored to give a set of mirrored digitized values, $I_{m1}$. An error value $E_1$ is calculated by comparing the set of digitized values $I_i$ with the set of mirrored digitized values $I_{m1}$. Subsequently a new set of digitized values of the sinusoidal waveform, $I_2$ is stored and a new error value $E_2$ is calculated by comparing the new set of digitized values $I_2$ with its mirror image.

If $E_2$ is less than $E_1$ then the power has changed direction.

As mentioned above, a physical cause of this sinus-noise can be a transformer which is close to saturation. Due to the saturation, the voltage in the transformer will then be distorted by superimposed harmonics. There is a physical relation between the voltage and the current in the electric power transmission lines 20 coupled to the input and output windings of the transformer, so that the harmonics will also be superimposed on the sinusoidal waveform of the alternating current signal. The harmonics will not follow the Uxl phase angle of the nominal frequency but will vary slightly for example due to different impact from the reactance and capacitive load.

By even more detailed analysis of the shape it is also possible to determine the Uxl phase angle, the capacitive/inductive load, the configuration of the power grid, as well as other parameters that characterize the power production, the grid and the consumer etc.

This analysis and information can either be used in real time inside the magnetic field sensor 30 or the information can be transferred to the processor 40, where the information can be further analyzed in combination with other information from the power grid.

An example calculation of the transfer function will now be explained. A transfer function is typically given by the formula:

$$\text{Excitation} \rightarrow \text{"Transfer function"} \rightarrow \text{Response.}$$

The excitation is normally measured by the magnetic field sensor 30 in the invention. This excitation will be the nominal periodic alternating current (50 or 60 Hz) with sinus-noise (as explained above). It is impossible to detect and distinguish two different sinusoidal periods from each other, but the superimposed noise can be detected and recognized as a unique signal. Consequently, the sinus-noise on the power grid is the alternating current signal seen and this alternating current signal can be handled as the excitation. The power grid will have a given transfer function at a given time at a given condition of the power grid. The transfer function will depend on the current flowing, the temperature, the configuration of the circuit breakers on the power grid etc.

The response is typically the sinus-noise measured with another magnetic field sensor 30 or by measurements of the propagation time of a current signal to the voltage sensor 50.

To get a full understanding and description of the power grid it is necessary to set up an equation or a lookup table that represents or is the transfer function. By making the above described measurements of the excitations and response we can then solve for the unknown transfer function This can be done for example by use of standard network analysis and synthesis method, e.g. by transfer to the frequency domain, Laplace transforms etc.

To solve for the unknown transfer function, we may also utilize other physical equations and known relations, for example the formula for speed of a signal in a power line.

The transfer function estimated is used as the $U_{t\_trans}$ (condition,x,y,z) which was used above to find the Uxl phase angle and the direction of the power flow. This is the transfer function of the voltage signal on the power grid and will make it possible to find the Uxl phase angle all over the power grid without measuring the magnitude of the voltage. For example, by placing one of the voltage sensors 50 in an office in Sweden and another one of the voltage sensors 50 in an office in Norway one can get information about some parts of the voltage transfer function from Sweden to Norway. There is a relation between the current and the voltage in the electric power transmission line 20 and by placing several ones of the magnetic field sensors 30 on the electric power transmission line 20 between Sweden and Norway one will get information about the transfer function for signals in the current.

In an alternative aspect of the invention, a measurement of the magnetic flux using a magnetic flux sensor close to the electrical power transmission line 20 is carried out in a conventional manner. This allows the current magnitude through the electrical power transmission line 20 to be determined. However, in this case, the voltage phase is determined by detecting noise that is induced by the electrical voltage across the electrical power transmission line 20. This may be done locally to the electrical power transmission line 20 by measuring electrical noise induced in the flux sensor itself, or alternatively it may be done remote from the electrical power transmission line 20 using a modified Global Grid Position and Timing System (GGPT) that is installed remote from the electrical power transmission line 20. Regardless of where the actual voltage phase measurement is made, a signal generator is provided that generates a reference signal whose period can be tuned using one or more filters. The signal generator may be installed within the magnetic flux sensor or GGPT according to whether local or remote measurement is performed. For example, the signal generator may be coupled locally by cable or via an RF connection. The signal generator may also be coupled remotely via the Internet or GPRS.

Filters in the signal generator may be adjusted to pick up signals from the measured magnetic flux sensing circuits. The filters can also be tuned to pick up either environmental noise or noise induced in the magnetic flux sensor or GGPT depending on whether local measurement or remote measurement is done.

The typical noise that may be picked up by the filter is noise from the electronic components in the magnetic flux sensor or GGPT or noise from the environment such as the electrical field from the electrical power transmission line 20. It may normally be assumed that the typical noise will include some flux components induced by the power grid in which case the Uxl phase angle may be calculated by using the measured magnetic flux for the current I and the reference generator for the voltage U.

In a further embodiment of the invention, a measurement station is installed close or proximate to the electric power transmission line 20 and measures the magnetic flux. At a given time provided by the Global Grid Position and Timing System (GGPT) the measurement station starts to count the number of sinusoidal periods which elapse (normally about $\frac{1}{50}$ s in Europe or $\frac{1}{60}$ s in USA). A voltage period counter unit (VPGU) is connected to the low voltage section of the power grid and counts the voltage periods on the low voltage grid. The VPCU is similar to the voltage sensor 50 described above with particular reference to FIG. 1. At a given time which is the same as the time provided to the measurement station by the GGPT the VPCU starts to count the number of periods which elapse. The measurement station and the VPCU transmit their data to a local server. The local server compares the two values of elapsed periods as received respectively from the measurement station and the VPCU and calculates the phase angle Uxl.

The numbers of elapsed periods from the measurement station or the VPCU do not need to be integers but can be decimals representing fractional periods that have elapsed during the measurement interval. Using the measured flux and a predetermined magnitude of grid voltage as provided, for example, by the electricity supplier, it is possible to calculate both the current I and the voltage U. By use of the calculated phase angle, it is possible to calculate the active, the reactive and the direction of the power.

The grid configuration module 260 shown in FIG. 2 continuously monitors the data in the system and calculates the instantaneous grid configuration at a given time. The grid configuration module 260 will mainly inspect the transfer functions of the power grid. If the transfer function changes, the grid configuration module 260 will evaluate if there is a new configuration of the power grid. If the grid configuration module 260 evaluates that there has been a change in the grid configuration, the g1id configuration module 260 will update to a new power grid state in the field description database 240.

As an example, the transfer function of the power grid will change immediately if two switches on the power grid at different places in location change mode.

The main reason for not measuring the magnitude of the voltage by the voltage sensor 50, but the phase, is because the transfer function for the magnitude of the voltage is too inaccurate to be used for the power calculation. Even if one placed a voltage sensor 50 proximate to the electric power transmission line the magnitude will cause voltage potential and phase errors owing to variations in the environment. In the invention, this error is avoided since the invention uses a predefined RMS value for the voltage stored in the field description database 240 and finds the voltage phase in an controlled environment (i.e. remote from the electric power transmission line) with less variations. This predefined RMS value for the voltage is typically determined from a priori knowledge as disclosed by the electricity supply company. In other words, if the nominal voltage of the power transmission line is 420 kV, then the voltage is assumed to be 420 kV. The value for the voltage can also be determined by one-time use of highly accurate and expensive electrical field sensors.

The data calculation module 250 calculates the current in a given electric power transmission line in the power grid from the raw database 220 and the field description database 240. The data calculation module 250 also uses the transfer function and computes the phase relation between the current I and the voltage U. This is done as described above. The calculation need not be done in real time but can be performed off-line with a delay anywhere between a few seconds to several days after the measurements were made. Normally the magnetic field sensor 30 and the voltage sensor 50 do not make a measurement at the same time. As a result, the data calculation module 250 searches for the values that are closest in time relative to the measurement made by the magnetic field sensors 30, and uses this in combination with the measured period time/frequency to interpolate values that fit as best as possible with the values of the magnetic field sensors 30. Once this is done, the data calculation module 250 calculates the effective power, the reactive power, the resistive power, loss at different places in the power grid etc. and updates the value database 255. The data calculation module 250 does not necessarily need to operate using a single sequential process, but may affect several sub processes, which can be located at different places in time and space.

As mentioned above, the measurements of the voltage U and the current I will typically not be done in the same place and time (in real-time) but will normally be done during different cycles of the alternating current. Consequently, there will normally be a need to interpolate backwards in order to estimate the same signal for both the voltage U and the current I both in space and time. To make this possible and to find the transfer function within the required accuracy, the magnetic field sensors 30, the voltage sensor 50, the raw database 220, the field description database 240 and the data calculation module 250 also need to keep track of accuracy at any time for the given values as the frequency(t), the derivative(t) of the values, the accuracy of the measurements (e.g. 51+−0.01% Hz), the deviation from normal +1

Hz, example the slope of the increase of the measurement/time (e.g. 0.002 Hz/s) etc. The system is adapted to evaluate values and either replace them with estimated values or give warnings if the values are outside given acceptable limits.

Since the magnetic field sensors 30 are normally solar/battery powered, it is desirable to use as little power as possible in the magnetic field sensor 30. Normally the measurements which are done in intervals will be sent in data packets from time to time. To reduce the size of the data packets, algorithms can be used to compress the data. In addition, the data packets will be temporarily stored (or never sent) if the measured changes from measurement to measurement are within certain limits. In this way the size of the data packets can possible be increased, but there will be less data packets to send. The average power consumption over a time period (example 24 h) is normally much more closely related to the number of packets transmitted separately than the size of the data packets. In other words, the power consumed is mainly related to the number of connections the transmitters establish with the receiver.

In addition to more standards methods to reduce the number of data size and data packets as mentioned above, the magnetic field sensor 30 has a data prediction module as described earlier that reduces the number of upstream and downstream data packet transfers. This makes the data transport more efficient and reduces the power consumption significantly.

The invention has been described with respect to the measurement of the magnetic field at the electric power transmission line and the voltage waveform at a distance. It will be appreciated that it would be possible to measure the voltage at the electric power transmission line and the current at a distance or any combination of current and/or voltage data in order to obtain the transfer function. Furthermore, it is possible to measure the current and/or voltage at more than one point.

| Reference Numerals | Names |
| --- | --- |
| 10 | Apparatus |
| 20 | Electric Power Transmission Line |
| 25 | Pylons |
| 30 | Magnetic Field Sensor |
| 33 | First Datalines |
| 34 | Wireless LAN Transceiver |
| 35 | Magnetic field |
| 36 | Mobile Data Access Interface |
| 37 | Magnetic Field Data |
| 38 | Clock |
| 40 | Processor |
| 45 | Network |
| 50 | Voltage Sensor |
| 53 | Second data lines |
| 55 | Voltage waveform data |
| 60 | Transform waveform calculator |
| 65 | Look-up Table |
| 200 | Authentification Check |
| 210 | Raw Data Storage Processor |
| 220 | Raw Database |
| 230 | Predict Data Processor |
| 240 | Field Description Database |
| 250 | Data calculation module |
| 255 | Value Database |
| 260 | Grid Configuration Module |
| 270 | Statistics and probability database |
| 280 | Economic Feature Database |
| 290 | Estimator Module |
| 295 | Database mirrors database |
| 310 | Searching coil |
| 315 | Amplifier |
| 320 | AID Converter |
| 330 | Microprocessor |

-continued

| Reference Numerals | Names |
|---|---|
| 340 | Global Positioning and Time Unit |
| 350 | GSM Module |
| 400 | Domestic Power Outlet |
| 410 | Resistance |
| 420 | Resistance |
| 430 | Ground |
| 440 | Comparator |
| 450 | Reference voltage |
| 460 | Output |
| 600 | Sinusoidal Power Source |
| 610 | Consumer |
| 620 | Sinusoidal Power Source |
| 630 | Consumer |
| 640 | Black Box |
| 650 | Middle Point |
| 660 | Point |
| 670 | Point |

The invention claimed is:

1. An apparatus for measuring power flowing in an electric power transmission line of a power grid, the apparatus comprising:
 a processor;
 at least one magnetic field sensor configured to measure time-dependent magnetic fields generated by a current flowing in the electric power transmission line and to predict a plurality of magnetic field values based at least in part on a statistical and trend analysis of a plurality of measured magnetic fields, wherein measuring the magnetic field comprises obtaining one or more time-dependent magnetic field values, and wherein the at least one magnetic field sensor comprises a timing unit configured to receive a timing signal, determine a period associated with the current, and record a time-dependent magnetic field value using the timing signal to indicate the time at which the time-dependent magnetic field value was obtained; and
 at least one voltage sensor configured to measure a time-dependent voltage in the power grid at a low voltage part of the power grid, wherein the voltage of the low voltage part of the power grid is reduced by a transformer relative to the voltage of the electric power transmission line, the at least one voltage sensor further configured to predict a plurality of voltage values based at least in part on a statistical and trend analysis of a plurality of measured voltages, wherein measuring the time-dependent voltage comprises obtaining one or more time-dependent voltage values, and wherein the at least one voltage sensor comprises a timing unit configured to receive the timing signal, and record a time-dependent voltage value using the timing signal to indicate the time at which the time-dependent voltage value was obtained;
 wherein the processor is configured to:
 calculate a phase relationship between the magnetic field and the voltage, and wherein calculating the phase relationship is based at least in part on comparing the period associated with the current, a period associated with the voltage, the time at which the time-dependent magnetic field value was obtained, and the time at which the time-dependent voltage value was obtained, and
 calculate the power flowing in the electric power transmission line from the time-dependent magnetic field value, the time-dependent voltage value, and the phase relationship, wherein, prior to transmitting the magnetic field values, the at least one magnetic field sensor is configured to:
 obtain a plurality of magnetic field values based at least in part on measuring magnetic field values associated with the magnetic field generated by the current flowing in the electrical power transmission line;
 compare each of the plurality of magnetic field values with a corresponding predicted magnetic field value; and
 identify at least one of the obtained magnetic field values to include in the magnetic field values transmitted to the processor based on determining the at least one of the obtained magnetic field values deviates from a corresponding predicted magnetic field value.

2. The apparatus of claim 1, wherein the at least one magnetic field sensor is arranged within 1 kilometer from the electric power transmission line.

3. The apparatus of claim 1, wherein the at least one voltage sensor and the electric power transmission line are connected to a same AC network of the power grid.

4. The apparatus of claim 1, wherein the at least one voltage sensor and the processor are placed in a same facility, and wherein the at least one magnetic field sensor is arranged between 25 meters and 400 meters from the electric power transmission line.

5. The apparatus of claim 1, wherein the at least one voltage sensor is located in an office, near a centralized computer, or at a position chosen dependent on a noise on the voltage in the electric power transmission line.

6. The apparatus of claim 1, wherein the calculating the power comprises calculating one or more of a magnitude of the power, a direction of the power flowing in the electric power transmission line, a power factor, an active power, and a reactive power.

7. The apparatus of claim 1, wherein the at least one magnetic field sensor is arranged at a distance that is at least 25 meters from the electric power transmission line.

8. The apparatus of claim 1, wherein the processor is connected to a look-up table, in which estimated values of phase relationships between voltages and magnetic fields are stored, and wherein the calculating of the phase relationship is based at least in part on estimating a transfer function between different physical locations of the voltage sensor and the magnetic field sensor.

9. A method for measuring power flowing in an electric power transmission line of a power grid, the method comprising:
 receiving a timing signal;
 measuring a magnetic field generated by a current flowing in the electric power transmission line, wherein measuring the magnetic field comprises obtaining one or more magnetic field values using a magnetic field sensor configured to predict a plurality of magnetic field values based at least in part on a statistical and trend analysis of a plurality of measured magnetic fields;
 time-tagging times when the magnetic field values were obtained using the timing signal;
 measuring a time period associated with the current;
 obtaining a plurality of voltage values on a low voltage part of the power grid using a voltage sensor configured to predict a plurality of voltage values based at least in part on a statistical and trend analysis of a plurality of measured voltages, wherein the voltage of the low voltage part of the power grid is reduced by a transformer relative to the voltage of the power transmission line;

time-tagging times when the voltage values were obtained using the timing signal;

measuring a time period associated with the voltage;

calculating a phase relationship between the one or more magnetic field values and the one or more voltage values, wherein calculating the phase relationship is based at least in part on the time period associated with the current, the time period associated with the voltage, the times when the magnetic field values were obtained, and the times when the voltage values were obtained; and calculating the power, flowing in the electric power transmission line, from at least the magnetic field values, the voltage values, and the phase relationship, wherein the magnetic field is measured proximate the transmission line, and wherein, prior to transmitting the voltage values, the at least one voltage sensor is configured to:

obtain a plurality of voltage values based at least in part on measuring voltage values associated with the voltage in the electrical power transmission line;

compare each of the plurality of voltage values with a corresponding predicted voltage value; and identify at least one of the obtained voltage values to include in the voltage values transmitted to the processor based on determining the at least one of the obtained voltage values deviates from a corresponding predicted voltage value.

10. The method of claim 9, wherein the calculating of the phase relationship comprises using a transfer function between different physical locations relative to the transmission line where the magnetic field is measured and the location on the power grid where the voltage is measured.

11. The method of claim 10, wherein the using the transfer function comprises using the measured magnetic field values as excitation data and the measured voltage values as response data in a network analysis.

12. The method of claim 9, wherein the calculating the power comprises transmitting to a processor the magnetic field values, the voltage values, the time period associated with the current, the time period associated with the voltage, and the phase relationship, and wherein the calculating the power comprises calculating one or more of a magnitude of the power, a direction of the power flowing in the electric power transmission line, a power factor, an active power, and a reactive power.

13. The method of claim 9, wherein, prior to transmitting the magnetic field values, the at least one magnetic field sensor is configured to:

obtain a plurality of magnetic field values based at least in part on measuring magnetic field values associated with the magnetic field generated by the current flowing in the electrical power transmission line;

compare each of the plurality of magnetic field values with a corresponding predicted magnetic field value; and identify at least one of the obtained magnetic field values to include in the magnetic field values transmitted to the processor based on determining the at least one of the obtained magnetic field values deviates from a corresponding predicted magnetic field value.

14. The method of claim 9, wherein one or more of:

the at least one magnetic field sensor is configured to preclude transmission of one or more obtained magnetic field values in the magnetic field values transmitted to the processor; and the at least one voltage sensor is configured to preclude transmission of one or more obtained voltage values in the voltage values transmitted to the processor.

15. The method of claim 9, further comprising:

predicting a plurality of magnetic field values, based at least in part on a statistical and trend analysis of the measured magnetic field values; and predicting a plurality of voltage values, based at least in part on a statistical and trend analysis of the measured voltage values.

16. The method of claim 15, further comprising:

obtaining a plurality of magnetic field values based at least in part on measuring magnetic field values data associated with the magnetic field generated by the current flowing in the electrical power transmission line;

comparing each of the plurality of magnetic field values with a corresponding predicted magnetic field value; and identifying at least one of the obtained magnetic field values to include in the magnetic field values transmitted to a processor based on determining the at least one of the obtained magnetic field values deviates from a corresponding predicted magnetic field value.

17. The method of claim 16, further comprising:

obtaining a plurality of voltage values based at least in part on measuring voltage values associated with the voltage in the electrical power transmission line;

comparing each of the plurality of voltage values with a corresponding predicted voltage value; and identifying at least one of the obtained voltage values to include in the voltage values transmitted to a processor based on determining the at least one of the obtained voltage values deviates from a corresponding predicted voltage value.

18. The method of claim 17, wherein at least one of:

one or more obtained magnetic field values are excluded from the magnetic field values transmitted to the processor; and one or more obtained voltage values are excluded from the voltage values transmitted to the processor.

19. A method for measuring power flowing in an electric power transmission line of a power grid, the method comprising:

receiving a timing signal;

measuring a magnetic field generated by a current flowing in the electric power transmission line, wherein measuring the magnetic field comprises obtaining one or more magnetic field values;

time-tagging times when the magnetic field values were obtained using the timing signal;

measuring a time period associated with the current;

measuring voltages in the electric power transmission line, wherein measuring the voltages comprises obtaining one or more voltage values;

time-tagging times when the voltage values were obtained using the timing signal;

measuring a time period associated with the voltage;

calculating a phase relationship between the one or more magnetic field values and the one or more voltage values, wherein calculating the phase relationship is based at least in part on the time period associated with the current, the time period associated with the voltage, the times when the magnetic field values were obtained, and the times when the voltage values were obtained;

calculating the power, flowing in the electric power transmission line, from at least the magnetic field values, the voltage values, and the phase relationship;

predicting a plurality of magnetic field values, based at least in part on a statistical and trend analysis of the measured magnetic field values;

predicting a plurality of voltage values, based at least in part on a statistical and trend analysis of the measured voltage values;

obtaining a plurality of voltage values on a low voltage part of the power grid, wherein the voltage of the low voltage part of the power grid is reduced by a transformer relative to the voltage of the power transmission line;

comparing each of the plurality of voltage values with a corresponding predicted voltage value; and identifying at least one of the obtained voltage values to include in the voltage values transmitted to a processor based on determining the at least one of the obtained voltage values deviates from a corresponding predicted voltage value, wherein the magnetic field is measured proximate the transmission line and the voltages are measured on a portion of the power grid operating at a voltage lower than a voltage of the transmission line.

\* \* \* \* \*